United States Patent
Iwane et al.

(10) Patent No.: US 7,764,049 B2
(45) Date of Patent: Jul. 27, 2010

(54) METHOD AND DEVICE FOR DETERMINING BATTERY DISCHARGE CAPABILITY, AND POWER SUPPLY SYSTEM

(75) Inventors: Noriyasu Iwane, Tokyo (JP); Koji Fujimura, Tokyo (JP); Takezo Sugimura, Tokyp (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/169,144

(22) Filed: Jul. 8, 2008

(65) Prior Publication Data
US 2009/0027007 A1 Jan. 29, 2009

Related U.S. Application Data

(63) Continuation of application No. PCT/JP2006/326188, filed on Dec. 28, 2006.

(30) Foreign Application Priority Data
Jan. 12, 2006 (JP) .............................. 2006-005420

(51) Int. Cl.
*H02J 7/00* (2006.01)
(52) U.S. Cl. .................. 320/136; 320/132; 320/134
(58) Field of Classification Search ................ 320/107, 320/132, 134, 136, 164
See application file for complete search history.

(56) References Cited

U.S. PATENT DOCUMENTS

| | | | |
|---|---|---|---|
| 6,160,382 A * | 12/2000 | Yoon et al. | 320/136 |
| 6,441,586 B1 * | 8/2002 | Tate et al. | 320/132 |
| 2003/0052690 A1 | 3/2003 | Schoch | |
| 2003/0184307 A1 * | 10/2003 | Kozlowski et al. | 324/427 |
| 2004/0158418 A1 | 8/2004 | Kato et al. | |
| 2007/0035307 A1 | 2/2007 | Schoch | |

FOREIGN PATENT DOCUMENTS

| | | |
|---|---|---|
| JP | 2002-319438 A | 10/2002 |
| JP | 2004-514249 A | 5/2004 |
| JP | 2004-241325 A | 8/2004 |
| WO | WO 2004/068157 A1 | 8/2004 |

* cited by examiner

*Primary Examiner*—Edward Tso
*Assistant Examiner*—Aaron Piggush
(74) *Attorney, Agent, or Firm*—Oblon, Spivak, McClelland, Maier & Neustadt, L.L.P.

(57) ABSTRACT

A method for determining battery discharge capability includes estimating the optimum state vector X by an extended Kalman filter operation. Using the estimated state vector X, element parameters of an equivalent circuit are renewed. Furthermore, based on the equivalent circuit using the renewed element parameters, at the time of discharging with a predetermined current pattern from a battery, a voltage drop $\Delta V$ is estimated. Therefore, the discharge capacity of the battery is determined.

9 Claims, 5 Drawing Sheets

METHOD AND DEVICE FOR DETERMINING BATTERY DISCHARGE CAPABILITY, AND POWER SUPPLY SYSTEM

TECHNICAL FIELD

The present invention relates to a technical field of a method and a device for determining battery discharge capability, and a power supply system, to determine a discharge capacity of a battery which supplies a power to a load.

BACKGROUND ART

Recently, for more improvement of a safe performance and a riding comfort or the like of a vehicle, electronic equipments to be in-car equipped are increased. Moreover, for reducing environmental load, not only a fuel economy improvement but also a popularization of start-stop system or the like is progressed.

With increasing such electronic equipments, popularizing the start-stop system, and the like, a necessity to monitor a condition of a battery and detect quickly a fault, a weak battery, or the like, is rapidly required. Corresponding with this, methods of estimating the state of health (SOH) or the state of charge (SOC) of the battery are proposed in a variety.

According to Patent Document 1, by a predetermined model calculation to calculate a battery voltage, using the battery voltage and based on a predetermined formula, the SOC of the battery is to be calculated. Regarding the above mentioned model calculation, a simple battery model with few element parameters is used. Moreover, the calculation result of the battery voltage and the measured battery voltage are fed back, then the above mentioned element parameters are to be corrected.

Furthermore, according to Patent Document 2, using a performance model of the battery with the SOC and the voltage of the battery as state parameters, by estimating the state based on a Kalman filter, the SOC of the battery is to be evaluated.

That is to say, using the above mentioned performance model of the battery, a voltage change for a measured current is predicted, then based on a differential between the predicted voltage and the measured voltage the state parameters are to be corrected. Hence, the SOC as one of the state parameters is obtained as a corrected result value.

[Patent Document 1] Japanese application publication No. 2004-514249

[Patent Document 2] Japanese application publication No. 2002-319438

DISCLOSURE OF THE INVENTION

Problems to be Solved by the Invention

As considering about an actual operating environment for a battery, response voltage at the time of current flowing through a load that is required to start up, i.e., state of function (SOF), is either within a stable operating range of the load or not, that becomes the most important information. Moreover, the above mentioned SOF changes in a variety, with depending on the state of the battery at the time of starting up requirement, for example, the amount of the load current that is supplied to other loads, or the like.

However, none of technologies to be able to provide the information regarding the above mentioned SOF is proposed. For a technology to achieve this, for example, the battery is modified as a electric equivalent circuit. Moreover, based on this equivalent circuit, at the time of the required load current pattern being flowed, the SOF is estimated. Therefore, a method, that determines the estimated SOF is either within the stable operating range of the load or not, is generally considered.

Regarding the above mentioned method of using the equivalent circuit, over a wide frequency range an impedance measurement of the battery has to be performed. Furthermore, for coinciding the measured impedance with the impedance calculated from the above mentioned equivalent circuit in the wide frequency range, each element parameter of the equivalent circuit is required to be predetermined.

However, as considering about an actual using environment for the battery, the impedance measurement over the wide frequency range to be necessary for predetermining each element parameter, has quite a difficulty from a point of view of a time spending for the measurement, a calculation load, or the like. Moreover, for a case of predetermining and memorizing each element parameter, with the battery aging or the like each element parameter has to be readjusted, and there is a problem that it is quite hard to perform this.

Regarding Patent Document 1 and Patent Document 2, based on a predetermined battery model the SOC of the battery is just estimated. Hence, it is not possible to predict the SOF for the load current at the time of a new load being started up.

Here, the present invention is presented for solving such a problem. Furthermore, by estimating the SOF for the required load current, a method for determining battery discharge capability or the like, that is able to determine the discharge capability of the battery, is offered and to be aimed.

Means for Solving the Problem

The first embodiment of the method for determining battery discharge capability of the present invention is the method for determining battery discharge capability based on an equivalent circuit of a battery, which comprises the steps of:

setting a state vector, which has elements of at least element parameters and a predetermined function of the element parameters of the equivalent circuit;

measuring for evaluating a current and a voltage of the battery;

estimating the state vector, using the measured current value and the voltage value, and SOC calculated by a predetermined SOC calculating method as observed values;

applying the element parameters as elements of the estimated state vector to the equivalent-circuit to estimate the voltage value of the battery at the time of discharging under a predetermined current pattern; and comparing the estimated voltage value with a predetermined voltage tolerance to determine the discharge capability of the battery.

In the second embodiment of the method for determining battery discharge capability of the present invention, the state vector is estimated using secondary observed values calculated from the current, the voltage and the state of charge (SOC) of the battery.

In the third embodiment of the method for determining battery discharge capability of the present invention, an impedance for one or more frequencies is added into elements of the observed values, and the state vector is estimated using the measured current value and the voltage value, the SOC calculated by the SOC calculating method, and the impedance for one or more frequencies which is calculated by a predetermined impedance calculating method.

In the fourth embodiment of the method for determining battery discharge capability of the present invention, the impedance calculating method measures the current and the voltage at the time of discharging or charging a pulse current through the battery, evaluates each amplitude constituent corresponding to the one or more frequencies by Fourier expanding the measured current value and the voltage value respectively, and then calculates the impedance for one or more frequencies from the amplitude constituent.

In the fifth embodiment of the method for determining battery discharge capability of the present invention, the impedance calculating method measures the current and the voltage at the time of power supplying to electric equipments from the battery, evaluates each amplitude constituent corresponding to the one or more frequencies by Fourier transforming the measured current value and the voltage value respectively, and then calculates the impedance for one or more frequencies from the amplitude constituent.

In the sixth embodiment of the method for determining battery discharge capability of the present invention, the impedance calculating method calculates the impedance Zbat of the battery, for the impedance (as Zmes) evaluated by the Fourier expanding or the Fourier transforming, to remove also an affect of the impedance (as Zx) of the electric equipments parallel connected with the battery, by a relational expression:

1/Zmes=1/Zx+1/Zbat.

In the seventh embodiment of the method for determining battery discharge capability of the present invention, the element parameters carry out a predetermined correction calculation regarding at least either one from the current value/a temperature/the SOC of the battery.

In the eighth embodiment of the method for determining battery discharge capability of the present invention, the SOC calculating method uses at least either one from a stable OCV measured value/a current integrated value/an I/V (I-V: current-voltage) characteristic of the battery.

The first embodiment of the device for determining battery discharge capability of the present invention is the device for determining battery discharge capability to determine the discharge capacity of the battery based on the equivalent circuit of the battery comprising:

a current sensor to determine the current of the battery;

a voltage sensor to determine the voltage of the battery; and a control means to determine the discharge capability of the battery, in which the state vector, which has element parameters of the equivalent circuit and predetermined functions of the element parameters as elements, is estimated using the current value inputted through the current sensor, the voltage value inputted through the voltage sensor, and the SOC calculated by the predetermined calculating method, the voltage value of the battery at the time of discharging under the predetermined current is estimated applying the element parameters as the elements of the estimated state vector to the equivalent circuit, and then the estimated voltage value is compared with the predetermined voltage tolerance to determine the discharge capability of the battery.

In the second embodiment of the device for determining battery discharge capability of the present invention, the control means adds the impedance for one or more frequencies into the elements of the observed values, and estimates the state vector using the current value and the voltage value inputted through the current sensor and the voltage sensor respectively, the SOC calculated by the SOC calculating method and the impedance for one or more frequencies calculated by the predetermined impedance calculating method.

In the third embodiment of the device for determining battery discharge capability of the present invention, the device further comprises a discharge circuit or a charge circuit for discharging or charging a pulse current to the battery; and the control means, in which the current value and the voltage value are inputted through the current sensor and the voltage sensor respectively at the time of discharging or charging the pulse current by the discharge circuit or the charge circuit, the current value and the voltage value are Fourier expanded or Fourier transformed respectively to evaluate each amplitude constituent corresponding to the one or more frequencies, and then the impedance for one or more frequencies is calculated from the each amplitude constituent.

The first embodiment of the power supply system of the present invention is the power supply system that is equipped with either one of the devices for determining battery discharge capability regarding the ninth embodiment through the eleventh embodiment.

EFFECTS OF THE INVENTION

According to the present invention, by estimating the SOF for a requested load current, a method for determining battery discharge capability or the like, that is able to determine the discharge capability of the battery, is able to be offered. According to the present invention, the SOF for the requested load current is to be predicted using an equivalent circuit that is to be learned optimally. Hence, even under the load operating environment that the battery is supplying power to the load, it is able to evaluate the discharge capability of the battery precisely with high accuracy.

Moreover, by using an impedance measurement for a predetermined frequency at the same time, a prediction precision of the battery discharge capability is able to be more improved. Furthermore, a value of an element parameter for the equivalent circuit is determined by being based on either a current/a temperature/the SOC of the battery. Hence, by the above mentioned equivalent circuit using this, the SOF is evaluated. Therefore, it becomes possible to determine the battery discharge capability with higher accuracy.

BRIEF DESCRIPTION OF DRAWINGS

FIG. 1

FIG. 2

FIG. 3

FIG. 4

FIG. 5

FIG. 6

FIG. 7

FIG. 8

FIG. 9

BRIEF DESCRIPTION OF THE REFERENCE NUMERALS

11 Power Supply System
12 BATTERY
13 ALTERNATOR
14 AMMETER
15 VOLTMETER
16 DEVICE FOR DETERMINING BATTERY DISCHARGE CAPABILITY
17 DISCHARGE CIRCUIT
18 LINE
19 LOAD
21 EQUIVALENT CIRCUIT
22, 23 CIRCUIT PART

BEST MODE FOR CARRYING OUT THE INVENTION

With referring to the drawings, regarding preferred embodiments of the present invention, methods and devices for determining battery charge capability, and components of a power supply system are described in detail. Here, regarding each component having a similar function, for drawing and describing simplification, it is shown with a similar symbol.

Figure 2:
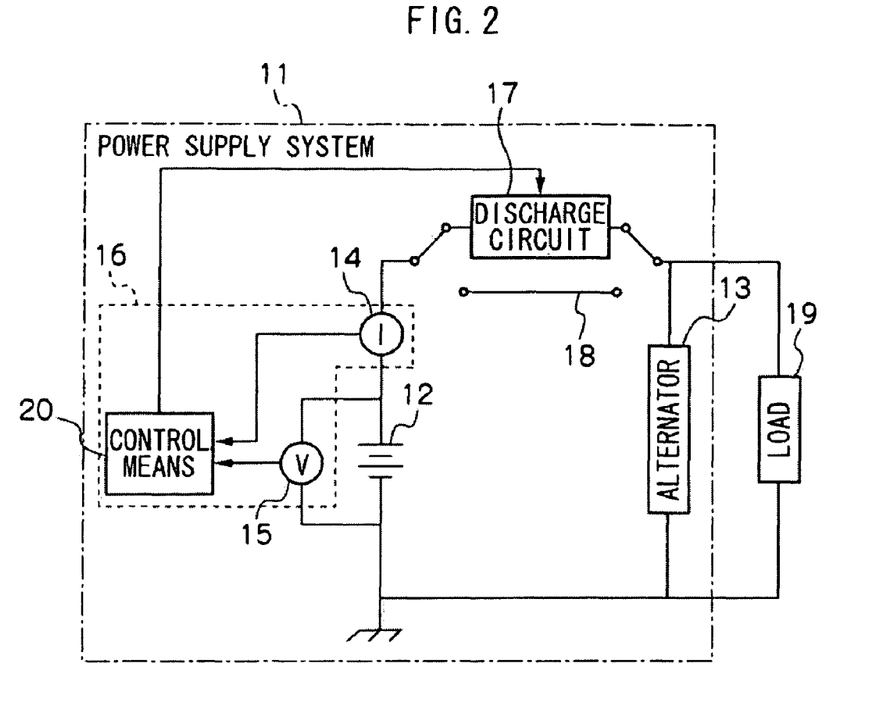
FIG. 2 is a block diagram to show one embodiment of a device for determining battery discharge capability and a power supply system of the present invention.

One embodiment of a device for determining battery discharge capability and a power supply system of the present invention is shown in FIG. 2. A power supply system 11 is equipped with a battery 12 and an alternator 13 to be the power supply. In a device for determining battery discharge capability 16, for measuring a current and a voltage of the battery 12, an amperemeter 14 and a voltmeter 15 are equipped. The device for determining battery discharge capability 16 is also equipped with a control means 20, that the current and the voltage are inputted with a predetermined time interval through the above mentioned amperemeter 14 and a voltmeter 15 respectively. Furthermore, based on the method for determining battery discharge capability of the present invention, the discharge capability for the battery 12 is determined.

Regarding the method for determining battery discharge capability of the battery 12 by the control means 20, the battery 12 is modified by a predetermined equivalent circuit model. Moreover, at the time of discharging under a predetermined current pattern, a voltage or a voltage drop is estimated using the equivalent circuit. Furthermore, by comparing the estimated voltage or the voltage drop with a predetermined tolerance, the discharge capability of the battery 12 is determined. Also, by the above mentioned method for determining discharge capability, for being able to determine accurately the discharge capability of the battery 12, it is necessary to be able to determine precisely the voltage or the voltage drop using the above mentioned equivalent circuit.

Regarding the method for determining discharge capability of the present invention, using a predetermined equivalent circuit of the battery, a state vector, that at least has an element parameter and a predetermined function of the element parameter of the above mentioned equivalent circuit as elements, is set. Also, an observed current and a voltage of the above mentioned battery and a SOC calculated by a predetermined calculating method are to be observed values. And, the above mentioned state vector is estimated using these values. Moreover, the above mentioned element parameter as the element of the estimated above mentioned state vector is applied to the above mentioned equivalent circuit. Moreover, by using this, at the time of discharging under a predetermined current pattern, the voltage value of the above mentioned battery is to be estimated.

Figure 3:
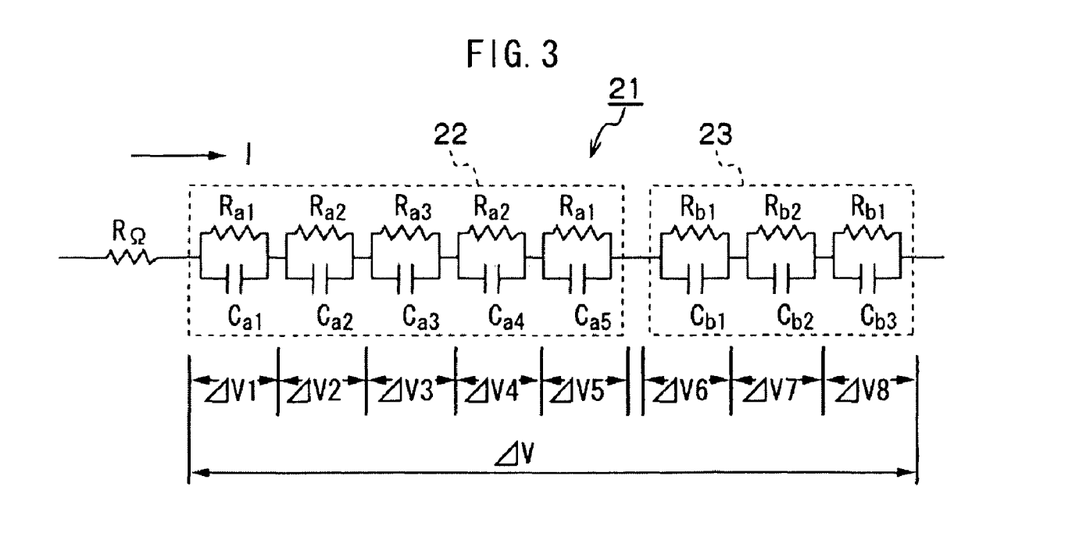
FIG. 3 is a circuit diagram to show one embodiment of an equivalent circuit model for a battery 12.
Figure 4:
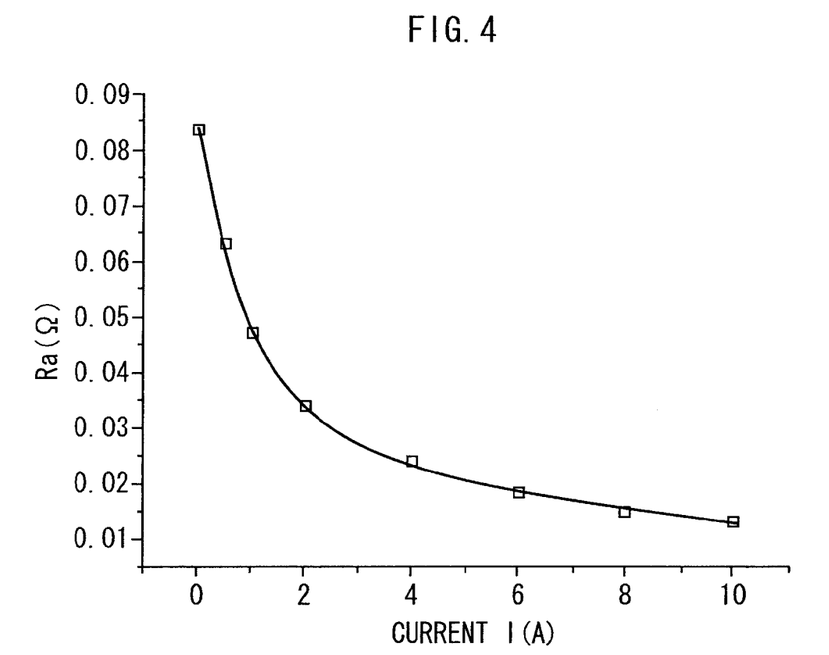
FIG. 4 is a graph to show a change of an element parameter Ra for a current I as x-axis.
Figure 5:
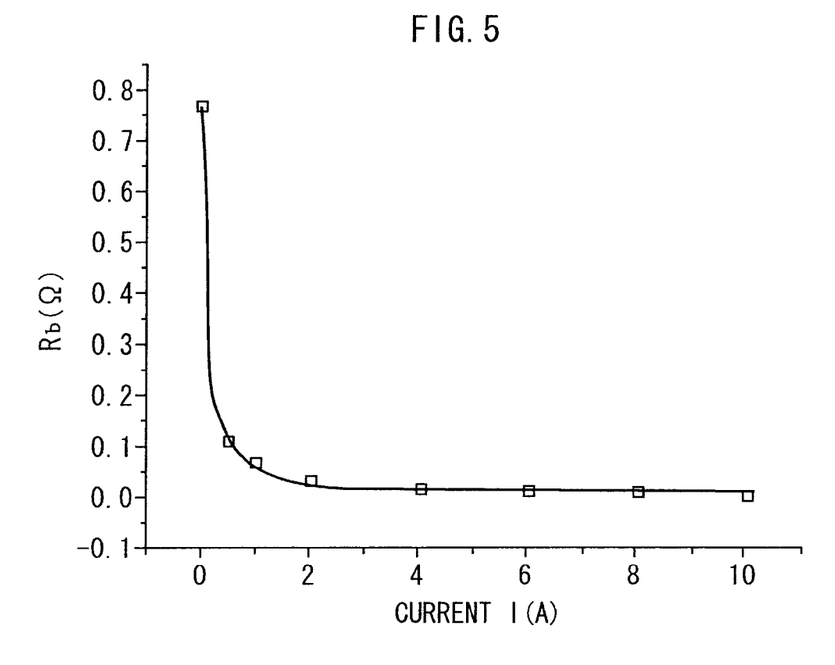
FIG. 5 is a graph to show a change of an element parameter Rb for a current I as x-axis.
Figure 6:
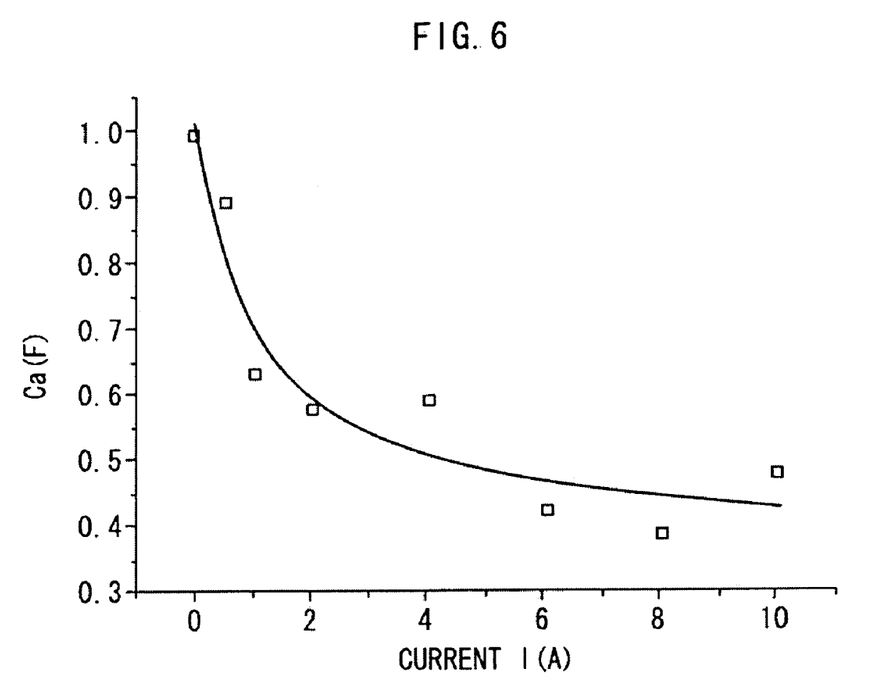
FIG. 6 is a graph to show a change of an element parameter Ca for a current I as x-axis.
Figure 7:
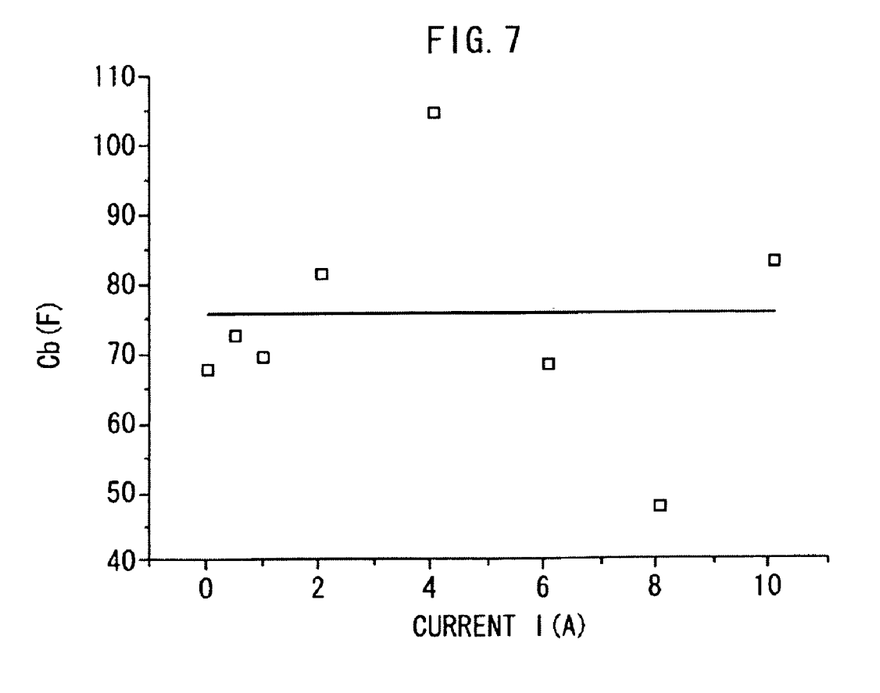
FIG. 7 is a graph to show a change of an element parameter Cb for a current I as x-axis.

One embodiment of an equivalent circuit model for the battery 12 is shown in FIG. 3. On an equivalent circuit 21 as shown in FIG. 3, 6 different element parameters for describing resistance RΩ, Ra1, Ra2, Ra3, Rb1, Rb2, and 8 different element parameters for describing capacitors Ca1, Ca2, Ca3, Ca4, Ca5, Cb1, Cb2, Cb3 are contained. Moreover, these element parameters are able to be substituted as below.

$Ra1 = \alpha \cdot Ra,$ $Ra2 = \beta \cdot Ra,$ $Ra3 = \gamma \cdot Ra,$ $Ca1 = \delta \cdot Ca,$ $Ca2 = \epsilon \cdot Ca,$ $Ca3 = \zeta \cdot Ca,$ $Ca4 = \eta \cdot Ca,$ $Ca5 = \theta \cdot a,$ $Rb1 = \tau \cdot Rb,$ $Rb2 = \kappa \cdot Rb,$ $Cb1 = \lambda \cdot Cb,$ $Cb2 = \mu \cdot Cb,$ $Cb3 = \nu \cdot Cb,$ Here, the coefficients $\alpha, \beta, \gamma, \delta, \epsilon, \zeta, \eta, \theta, \tau, \kappa, \lambda, \mu$ and $\nu$ are able to be predetermined as fixed constants by an experiment or the like preliminarily. Therefore, RΩ, Ra, Ca, Rb and Cb in the above equations are able to be estimated as the element parameters.

Regarding the equivalent circuit 21 in FIG. 3, circuit part 22 containing the element parameters Ra and Ca, circuit part 23 containing the element parameters Rb and Cb, and a voltage drop ΔV due to the RΩ are, for a current and a voltage of the battery 12 as I and V respectively, able to be described as $\Delta V = V - OCV$ (equation 1).

Regarding the control means 20 of the present embodiment, using the equivalent circuit 21, with the voltage drop ΔV in the above expression as a secondary observed value, a state vector containing the above mentioned element parameters is estimated. Moreover, at the time of flowing a predetermined current pattern through the equivalent circuit, by comparing a predicted value of a voltage drop ΔVx with a predetermined tolerance, the discharge capability of the battery 12 is to be determined.

Figure 1:
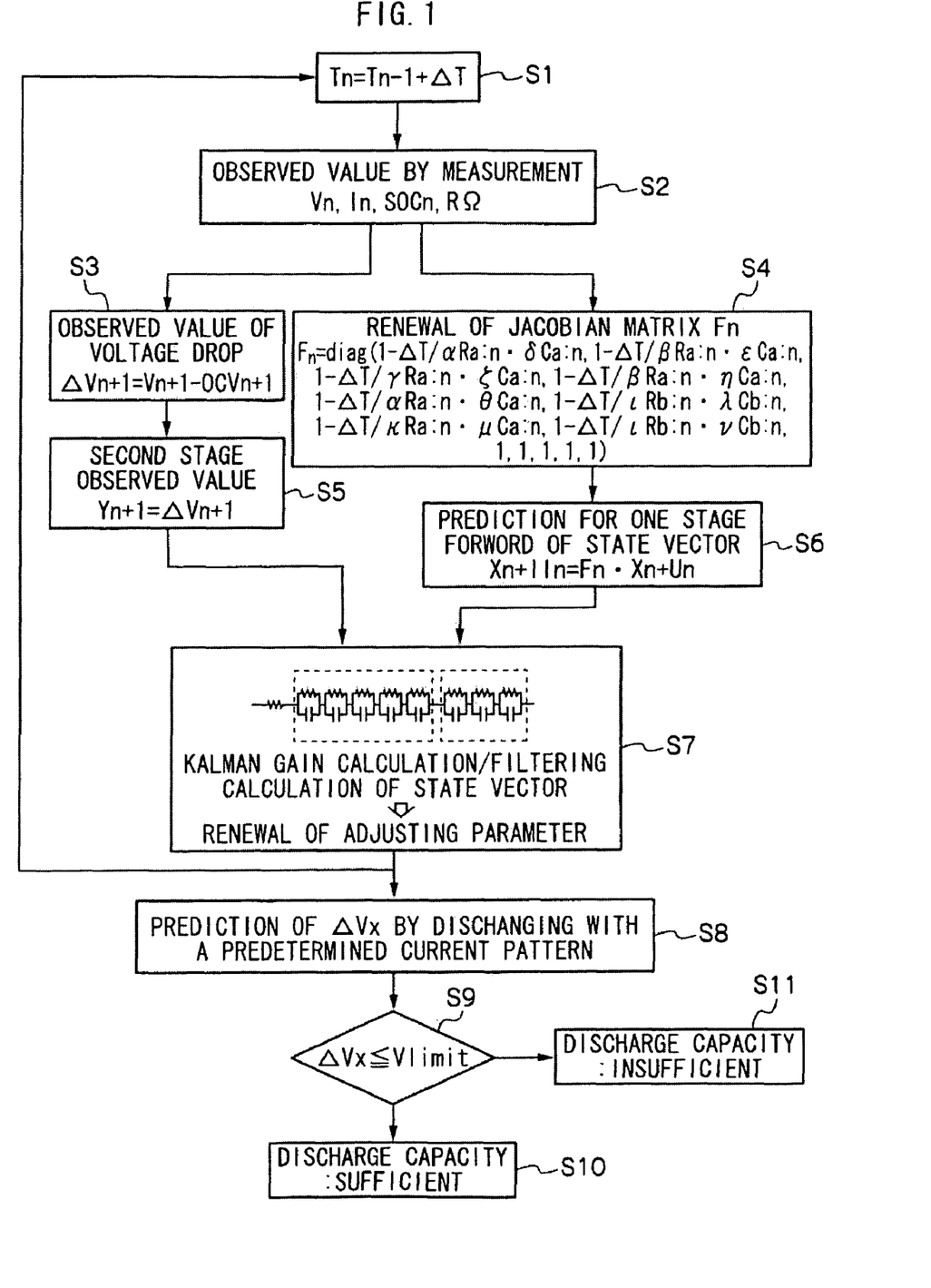
FIG. 1 is a block diagram to show one embodiment of a method for determining battery discharge capability of the present invention.

Regarding a method for determining discharge capability for the battery 12 that is performed by the control means 20, it is described in detail below using FIG. 1. FIG. 1 is a block diagram to show one embodiment of the method for determining battery discharge capability of the present invention.

For accurately determining discharge capacity of the battery 12, at the time of discharging under a predetermined current pattern through the equivalent circuit 21 of the battery 12, the voltage drop ΔVx is need to be precisely estimated. Therefore, according to the method for determining battery discharge capability of the present embodiment, the battery is observed in a discrete time of a predetermined interval. Furthermore, based on the observed data, by learning element parameters of the equivalent circuit 21, the voltage drop ΔVx of the battery 12 is able to be estimated with high accuracy.

As a method for optimizing the element parameters RΩ, Ra, Ca, Rb and Cb contained in the equivalent circuit 21, methods, for example, using a least square operation, an extended Kalman filter, a proper educated neural network, or the like, are known. For the method for determining battery discharge capability of the present invention, any of these methods may be used. Regarding the present embodiment as shown in FIG. 1, the extended Kalman filter is used as one of the most popular and preferred methods.

Regarding the extended Kalman filter operation, the above mentioned element parameters or the values including those given by predetermined expressions are described as a state vector. Moreover, a current In and a voltage Vn that are measured in a predetermined discrete time interval, and a state of charge SOCn that is also measured or calculated are to be elements for forming an observed value vector. Furthermore, to minimize an expected value error of the above mentioned observed value vector from the above mentioned state vector, the state vector is renewed.

Regarding a normal method of the above extended Kalman filter operation, a renewal of a Jacobian, a prediction for one stage forward, a Kalman gain calculation, and a filtering operation are repeated with following this order. By this, the above mentioned state vector is able to be estimated sequentially. Hence, as the estimation result of the above mentioned state vector, the constants of the equivalent circuit RΩ, Ra, Ca, Rb and Cb can be renewed to be the optimum.

Regarding the present embodiment as shown in FIG. 1, the renewal of the state vector and obtaining the observed values for the battery 12 are executed in every time interval ΔT. A step S1 means that time passes from the last execution time Tn−1 with the above mentioned time interval ΔT and achieves to the execution time Tn. When it achieves the execution time Tn, at a step S2 measurements for the battery 12 are performed.

At the step S2, using the amperemeter 14 and the voltmeter 15, a current In+1 and a voltage Vn+1 for the battery 12 measured at the n+1th time are inputted. Also, by a predetermined SOC calculating method, a SOCn+1 is calculated. As the above mentioned SOC calculating method, there is for example, for the battery 12, a method of using a stable OCV measured value at a startup initial stage by being combined with a current integrated value, a method of using an I/V characteristic under an operating environment, or the like, and either method may be used.

According to the present embodiment, the discharge capability of the battery 12 is to be determined by a voltage drop magnitude from a base voltage. That is to say, at the time of discharging under a predetermined current pattern, when the voltage drop from the above mentioned base voltage becomes larger than a predetermined tolerance, the discharge capability is to be determined as insufficiency. For the voltage drop of the battery 12, for example, it is able to be determined by the ΔV described on the equivalent circuit 21 as shown in FIG. 3.

Regarding a step S3, as the observed data obtained at the step S2, based on the In+1, the Vn+1 and the SOCn+1, a voltage drop ΔVn+1 is calculated. The voltage drop ΔVn+1 is able to be calculated by the following expression.

$$\Delta Vn+1 = Vn+1 - OCVn+1 \quad \text{(equation 2)}.$$

Here, the OCVn+1 is able to be calculated from the SOCn+1 obtained at the step S2 by the following expression.

$$OCV = a \cdot SOC + b \quad \text{(equation 3)}.$$

The above expression is for calculating a stable OCV at the time Tn+1, and a preformed formula by an experiment or the like is able to be used. The coefficient a and b, for changing with depending on such as a temperature, may be set as a table form or a function formula.

Here, at a step S4, using observed values at the n times and the last state vector estimated value, a renewal of a Jacobian Fn is performed. The Jacobian Fn of the present embodiment is given as $$Fn = \text{diag}(1 - \Delta T/\alpha Ra{:}n \cdot \delta Ca{:}n,\ 1 - \Delta T/\beta Ra{:}n \cdot \epsilon Ca{:}n,\ 1 - \Delta T/\gamma Ra{:}n \cdot \zeta Ca{:}n,\ 1 - \Delta T/\beta Ra{:}n \cdot \eta Ca{:}n,\ 1 - \Delta T/\alpha Ra{:}n \cdot \theta Ca{:}n,\ 1 - \Delta T/\kappa Rb{:}n \cdot \lambda Cb{:}n,\ 1 - \Delta T/\kappa Ra{:}n \cdot \lambda Ca{:}n,\ 1 - \Delta T/\kappa Rb{:}n \cdot \nu Cb{:}n, 1,1,1,1,1).$$

At a step S5, from the observed values obtained by the measurement at the step S3, the ΔVn+1 is calculated and to be as an observed value Yn+1 on the extended Kalman filter calculation.

$$Yn+1 = \Delta Vn+1 \quad \text{(equation 4)}.$$

In FIG. 3, for example the voltage drop ΔV1n for the first RC parallel portion in the circuit part 22 is described as $$\Delta V1{:}n+1 = \Delta V1n + \Delta T\{In/Ca1 - Vn/(Ra1 \cdot Ca1)\} \quad \text{(equation 5)}.$$

Here a state vector $Xn^T$ is set as $$XnT = (\Delta Va1n, \Delta Va2n, \Delta Va3n, \Delta Va4n, \Delta Va5n, \Delta Vb1n, \Delta Vb2n, \Delta Vb3n, R\Omega{:}n, Ra{:}n, Ca{:}n, Rb{:}n, Cb{:}n) \quad \text{(equation 6)},$$

and an input vector $Un^T$ is set as $$Un^T = (\Delta t \cdot In/\delta Ca{:}n, \Delta t \cdot In/\epsilon Ca{:}n, \Delta t \cdot In/\zeta Ca{:}n, \Delta t \cdot In/\eta Ca{:}n, \Delta t \cdot In/\theta Ca{:}n, \Delta t \cdot In/\lambda Cb{:}n, \Delta t \cdot In/\mu Cb{:}n, \Delta t \cdot In/\nu Cb{:}n, 0,0,0,0,0) \quad \text{(equation 7)}.$$

Therefore, at a step S6, a predicted value Xn+1|n for one stage forward of the Xn is calculated as $$Xn+1|n = FnXn + Un \quad \text{(equation 8)}.$$

Moreover, by $$Hn^T = (1, 1, 1, 1, 1, 1, 1, 1, In, 0, 0, 0, 0) \quad \text{(equation 9)},$$

it is able to be described as $$\text{system equation: } Xn+1 = FnXn \quad \text{(equation 10)},$$

$$\text{observation equation: } Yn = Hn^T Xn \quad \text{(equation 11)}.$$

Using the one stage forward estimated value Xn+1|n and the observed value Yn+1 of the above mentioned state vector, at a step S7, by an extended Kalman filter operation using a Kalman gain calculation and a filtering calculation, the optimum state vector Xn is estimated consecutively. Moreover, using the estimated state vector X, the above mentioned element parameters are renewed to be the optimum.

Based on the equivalent circuit 21 using the above mentioned element parameters that are renewed by the above mentioned extended Kalman filter operation, at a step S8, at the time of discharging with a predetermined current pattern from the battery 12, the voltage drop ΔVx is estimated. The above predetermined current pattern, for example, by adding the current pattern of a load, which is to be newly started up, to the present discharge current, is able to be determined.

For a specific calculation method thereof, using the relation of (equation 5) and a value $Ix{:}n{+}1$ of a predetermined current pattern, as $$\Delta Vx{:}n{+}1 = \Delta V1n{+}1 + \Delta V2n{+}1 + \Delta V3n{+}1 + \Delta V4n{+}1 + \Delta V5n{+}1 + \Delta V6n{+}1 + \Delta V7n{+}1 + \Delta V8n{+}1 + R\Omega \cdot Ix{:}n{+}1 \quad \text{(equation 12)},$$

it is able to be calculated consecutively.

Also, as a method for reducing a calculation load, with somewhat lower accuracy than the above mentioned method, however, by evaluating expediently from experiments regarding a relation of $\Delta Vx = G(Ra, Rb, Ix)$ such as $\Delta Vx = (Ra+Rb) Ix$, $\Delta Vx$ 32 Ra Ix, $\Delta Vx = Rb$ Ix, or the like, there is no problem for the calculations thereby.

At a step S9, by comparing the above predicted voltage drop $\Delta Vx$ with a predetermined tolerance $\Delta V\text{limit}$, when the $\Delta Vx$ is below the $\Delta V\text{limit}$, the discharge capability is determined to be sufficient (Step 10). However, when the $\Delta Vx$ is above the $\Delta V\text{limit}$, the discharge capability is determined to be insufficient (Step 11).

As being explained using the above mentioned embodiments, according to the present invention, at the time of discharging under the predetermined current pattern, by using the equivalent circuit which is to be optimally learned, the voltage or the voltage drop of the battery is predicted. Hence, even under the load operating environment that the battery is supplying power to the load, it becomes possible to estimate precisely regarding the discharge capability of the battery.

Another embodiment of the method for determining battery discharge capability of the present invention is explained below. Regarding the present embodiment, an impedance for one or more frequencies is added as an observed value. For example, the $R\Omega$ as one of the element parameters is to be calculated using the above mentioned impedance which is obtained by a measurement.

Regarding the present embodiment, for example, the $R\Omega$ as one of the element parameters is evaluated by a measurement and to be an observed value. Thus, from equation 6, a state vector $X^T$ is able to be descried as $$X^T = (\Delta Va1n, \Delta Va2n, \Delta Va3n, \Delta Va4n, \Delta Va5n, \Delta Vb1n, \Delta Vb2n, \Delta Vb3n, Ra{:}n, Ca{:}n, Rb{:}n, Cb{:}n) \quad \text{(equation 13)}.$$

As shown in the above expression, regarding the present embodiment, the element parameters to be learned are definable as 4 of Ra, Ca, Rb and Cb. Hence, the calculation load reduction and an accuracy improvement are able to be achieved.

Here, by setting each matrix and vector as $$Fn = \text{diag}(1 - \Delta T/\alpha Ra{:}n \cdot \delta Ca{:}n,\ 1 - \Delta T/\beta Ra{:}n \cdot \epsilon Ca{:}n, 1 - \Delta T/\gamma Ra{:}n \cdot \zeta Ca{:}n,\ 1 \cdot \Delta T/\beta Ra{:}n \cdot \eta Ca{:}n, 1 - \Delta T/\alpha Ra{:}n \cdot \theta Ca{:}n,\ 1 - \Delta T/\kappa Rb{:}n \cdot \lambda Cb{:}n, 1 - \Delta T/\kappa Ra{:}n \cdot \mu Ca{:}n,\ 1 - \Delta T/\kappa Rb{:}n \cdot \nu Cb{:}n, 1, 1, 1, 1) \quad \text{(equation 14)},$$

$$Un^T = (\Delta t\ In/\delta Ca{:}n,\ \Delta t\ In/\epsilon Ca{:}n,\ \Delta t\ In/\zeta Ca{:}n,\ \Delta t\ In/\eta Ca{:}n,\ \Delta t\ In/\theta Ca{:}n,\ \Delta t\ In/\lambda Cb{:}n,\ \Delta t\ In/\mu Cb{:}n,\ \Delta t\ In/\nu Cb{:}n,\ 0, 0, 0, 0) \quad \text{(equation 15)},$$

$$H^T = (1, 1, 1, 1, 1, 1, 1, 1, 0, 0, 0, 0) \quad \text{(equation 16)},$$

it is possible to be calculated as similar to the previous embodiment.

As a method for calculating the above mentioned impedance for one or more frequencies, a current at the time of discharging or charging a pulse current through the battery 12, and the function voltage at that time are measured. Moreover, by Fourier expanding of the above mentioned current value and the voltage value, each amplitude constituent corresponding to the above one or more frequencies is obtained respectively. Therefore, using the above mentioned each amplitude constituent, the above mentioned impedance for one or more frequencies is calculated, and this is to be the calculating method thereby.

A power supply system 11 as shown in FIG. 2 is equipped with a discharge circuit 17 for discharging a pulse current from the battery 12. Moreover, for charging the pulse current to the battery 12, it is able to be charged by an alternator 13 via a line 18.

For another method of calculating the above mentioned impedance for one or more frequencies, under the load operating environment of the battery 12, that is to say, under a state that the battery 12 is supplying power to a load 19, the current and the voltage of the battery 12 is measured. Moreover, by Fourier transforming the measured current and the voltage, each amplitude constituent corresponding to the above mentioned one or more frequencies is evaluated. Therefore, using each amplitude constituent, the above mentioned impedance for one or more frequencies is able to be calculated.

Due to the battery 12 and the load 19 being connected in parallel to be a parallel circuit, regarding the above mentioned either method for calculating impedance, under an actual vehicle environment, a total impedance of the above mentioned parallel circuit is to be measured. That is to say, as the impedance of the battery 12 Zbat, and the impedance of the load Zx, the impedance calculated by the measured value is Zmes in the following expression.

$$1/Zmes = 1/Zx + 1/Zbat \quad \text{(equation 17)}.$$

The impedance Zx of the load 19 is large enough compared with the impedance Zbat of the battery 12. Therefore, it is understood from the above expression that the calculated impedance Zmes may approximately equal to the impedance Zbat of the battery 12.

Furthermore, by removing an affect of the impedance Zx of the load 19 from the impedance Zmes as based on (equation 17), it is also possible to calculate the impedance Zbat of the battery 12. Regarding the impedance Zx of the load 19, a value, which is predetermined by a measurement beforehand for each vehicle type, may be used by memorizing thereof, or it may also be obtained by learning in the load operating environment.

Yet another embodiment of the method for determining battery charge capability of the present invention is explained below. Regarding the above mentioned embodiment, the above mentioned element parameter, that is renewed at the step S7 in FIG. 2, is used as it is. Moreover, based on the equivalent circuit 21, at the time of discharging under a predetermined current pattern, the voltage drop $\Delta V$ is predicted.

Generally, it is known that circuit parameters of the equivalent circuit 21 nonlinearly change with depending on a discharged current value. Hence, at the time of renewing the above mentioned element parameter which determines the circuit constant, when the discharge current is quite different from the current value of the above predetermined current pattern, there is a possibility to include a measurable error on the predicted value of the voltage drop by the equivalent circuit 21.

Thus, regarding the present embodiment, with depending on the current value of the above predetermined current pattern, the above mentioned element parameters are to be determined. The element parameters Ra, Ca, Rb and Cb are to be functions with depending on the current I as described below.

$$Ra(I)=f1(a)\exp\{-I/f2(a)\}+f3(a)\exp\{-I/f4(a)\}+a \quad \text{(equation 18)},$$

$$Ca(I)=f5(b)\exp\{-I/f6(b)\}+f7(b)\exp\{-I/f8(b)\}+b \quad \text{(equation 19)},$$

$$Rb(I)=f9(c)\exp\{-I/f10(c)\}+f11(c)\exp\{-I/f12(c)\}+f13(c)\exp\{-I/f14(c)\}+c \quad \text{(equation 20)},$$

$$Cb(I)=d \quad \text{(equation 21)}.$$

Regarding the above mentioned (equation 18) through (equation 21), a, b, c and d are constants, and f1 to f14 are functions of the above mentioned constants. As an example of the most simple function formula, for example, it is able to be a linear expression such as $$f1(a)=\psi a+\omega \quad \text{(equation 22)}.$$

Here, $\psi$, $\omega$, or the like as the coefficient in each function is able to be predetermined by an experiment or the like.

One embodiment of the functions in (equation 18) through (equation 19) is shown in FIG. 4 through 7. FIG. 4 through 7 are graphs to show changes of each element parameter Ra, Ca, Rb, or Cb for a current I as x-axis. From each graph, the constants a, b, c, d, and f1 to f14, that are included in the functions of (equation 18) through (equation 21), are able to be determined.

To the above determined functions of (equation 18) through (equation 21), by substituting a current value of a target current pattern, the value of the element parameters Ra, Ca, Rb and Cb are determined. Using these values, by the equivalent circuit 21, at the time of discharging under the above mentioned target current pattern, the voltage drop $\Delta V$ is able to be precisely predicted.

Figure 8:
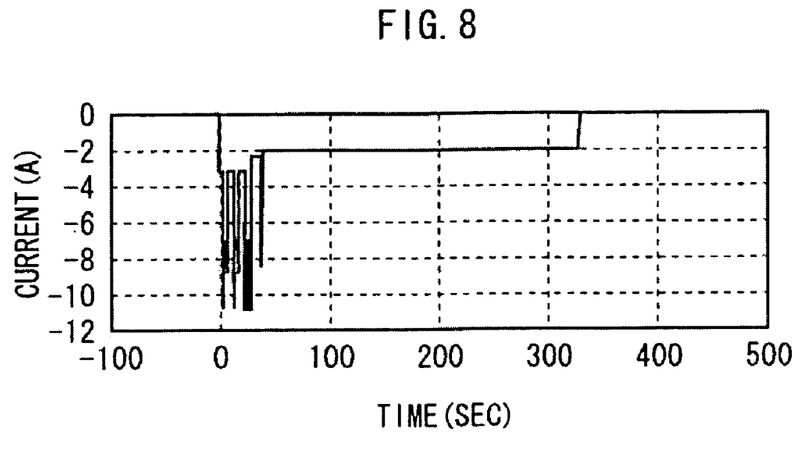
FIG. 8 is a graph to show one embodiment for a target current pattern.
Figure 9:
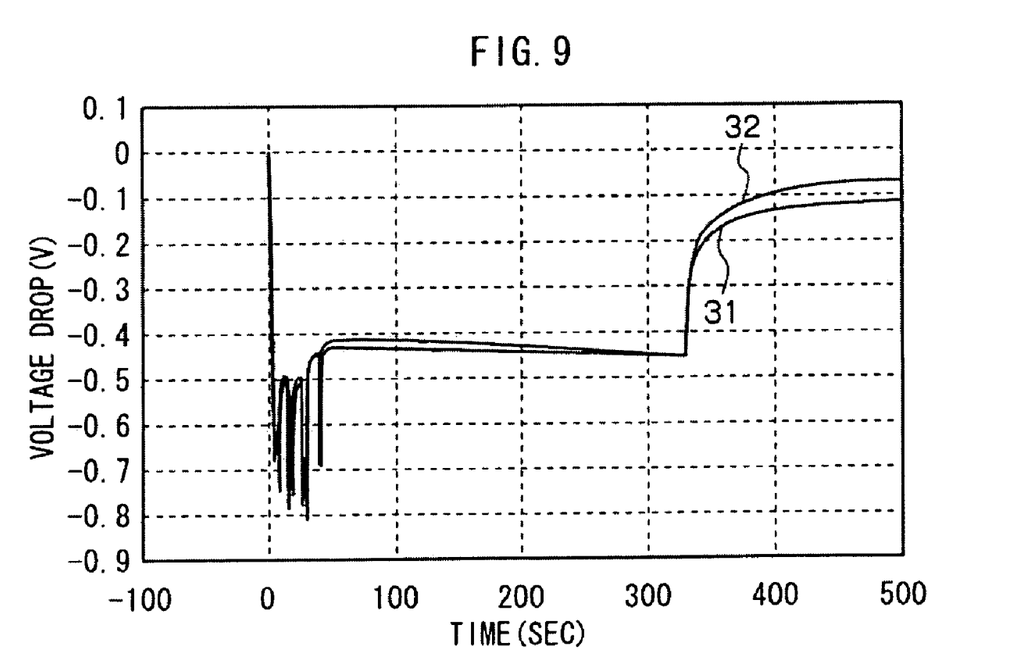
FIG. 9 is a graph to show a prediction result of a voltage drop at the time of discharging under the target current pattern in FIG. 8.

As above mentioned, from (equation 18) through (equation 21), for the current value of the target current pattern, the value of the element parameters Ra, Ca, Rb and Cb (hereinafter, it is described as Ra–x, Ca–x, Rb–x and Cb–x, respectively) are evaluated. Using these values, the discharge capability of the battery 12 is determined, and one embodiment thereof is shown in FIG. 8 and FIG. 9. FIG. 8 is one embodiment for the target current pattern. FIG. 9 is a graph to show a prediction result of the voltage drop at the time of discharging under the target current pattern in FIG. 8.

In FIG. 9, a graph 31 means the voltage drop predicted by using the equivalent circuit 21, and a graph 32 means a measurement result at the time of actual discharging under the current pattern in FIG. 8. At the time of discharging under the current In, using (equation 2), the function voltage is evaluated by the following expression $$Vn=OCVn+R\Omega \cdot In+\Delta Vn$$

Here, using the values of element parameters Ra–x, Ca–x, Rb–x and Cb–x, the current In and the previous $\Delta Vn-1$, $\Delta Vn$ is calculated by the following equation $$\Delta Vn=F(Ra-x, Ca-x, Rb-x, Cb-x, In, \Delta Vn-1)$$

According to FIG. 9, the voltage drop 31 of the predicted result and the actual voltage drop are in well correspondence as shown. Therefore, it is appreciated that the method for determining battery discharge capability of the present embodiment is possible to determine the discharge capability of the battery 12 in extremely high accuracy.

Also, addition to the above mentioned element parameters, by performing the similar correction on the other parameters such as the SOC and the like, it is appreciated that the accuracy is able to be improved more. Moreover, regarding the above mentioned element parameters, instead of being functions of the current I dependent, it is also possible to be the functions of the temperature or the SOC of the battery 12 and to perform the correction as similar to the above mention. Also, it is possible to be the functions of either 2 or more from the current, the temperature and the SOC.

What is claimed is:

1. A method for determining battery discharge capability based on an equivalent circuit of a battery, comprising:
    setting a state vector, including at least element parameters and a predetermined function of the element parameters of the equivalent circuit;
    measuring a current value and a voltage value of the battery;
    estimating the state vector using the measured current value and the measured voltage value, and a state of charge (SOC) calculated by a predetermined SOC calculating method as observed values;
    applying the element parameters, calculated according to the predetermined function at a predetermined current pattern, as elements of the estimated state vector to the equivalent circuit to estimate the voltage value of the battery at a time of discharging under the predetermined current pattern, and the predetermined current pattern includes a present discharge current and a current of a load to be newly added to the present discharge current applied to the battery; and
    comparing the estimated voltage value with a predetermined voltage tolerance to determine the discharge capability of the battery.

2. The method for determining battery discharge capability of claim 1, wherein the state vector is estimated using secondary observed values calculated from the measured current value, the measured voltage value, and the state of charge (SOC) of the battery.

3. The method for determining battery discharge capability of claim 1, wherein impedance for one or more frequencies is added into elements of the observed values; and
    the state vector is estimated using the measured current value and the measured voltage value, the SOC calculated by the SOC calculating method, and the impedance for one or more frequencies which is calculated by a predetermined impedance calculating method.

4. The method for determining battery discharge capability of claim 3, wherein the impedance calculating method measures the current value and the voltage value at the time of discharging or charging a pulse current through the battery, evaluates each amplitude constituent corresponding to the one or more frequencies by Fourier expanding the measured current value and the measured voltage value respectively, and then calculates the impedance for one or more of the frequencies from the amplitude constituent.

5. The method for determining battery discharge capability of claim 3, wherein the impedance calculating method measures the current value and the voltage value at a time of power supplying to electric equipment from the battery, evaluates each amplitude constituent corresponding to the one or more frequencies by Fourier transforming the measured current value and the measured voltage value respectively, and then calculates the impedance for one or more of the frequencies from the amplitude constituent.

6. The method for determining battery discharge capability of claim 4, wherein the impedance calculating method calculates impedance Zbat of the battery, for impedance (as Zmes) evaluated by the Fourier expanding, to remove impedance (as Zx) of the electric equipment connected in parallel with the battery, by a relational expression:

$$1/Zmes = 1/Zx + 1/Zbat.$$

7. The method for determining battery discharge capability of claim 1, further comprising:
   carrying out a correction calculation of the element parameters based on at least one from a group comprising the measured current value, a temperature, and the SOC of the battery.

8. The method for determining battery discharge capability of claim 1, wherein the SOC calculating method uses at least one from a group comprising a stable OCV measured value, a current integrated value, and I/V (I-V: current-voltage) characteristic of the battery.

9. The method for determining battery discharge capability of claim 5, wherein the impedance calculating method calculates impedance Zbat of the battery, for impedance (as Zmes) evaluated by the Fourier transforming, to remove impedance (as Zx) of electric equipment connected in parallel with the battery, by a relational expression:

$$1/Zmes = 1/Zx + 1/Zbat.$$

* * * * *